United States Patent
McGee et al.

(10) Patent No.: US 6,760,855 B1
(45) Date of Patent: Jul. 6, 2004

(54) SYSTEM AND METHOD FOR REDUCING A GROUND BOUNCE DURING WRITE BY SELECTIVELY DELAYING ADDRESS AND DATA LINES WITH DIFFERENT MULTIPLE PREDETERMINED AMOUNT OF DELAY

(75) Inventors: William A. McGee, San Jose, CA (US); Philip Enrique Madrid, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 567 days.

(21) Appl. No.: 09/594,833

(22) Filed: Jun. 14, 2000

(51) Int. Cl.[7] .................................................. G06F 1/18
(52) U.S. Cl. ........................ 713/401; 713/400; 713/500; 710/104; 710/305; 710/315; 711/105; 365/139; 365/194; 365/230; 365/233
(58) Field of Search ................................. 713/401, 400, 713/500; 710/104, 305, 315, 10, 36, 51, 3, 9, 61; 711/105; 365/233, 230, 139, 194

(56) References Cited

U.S. PATENT DOCUMENTS

| | | | |
|---|---|---|---|
| 4,857,765 A | * 8/1989 | Cahill et al. | 326/26 |
| 4,914,653 A | 4/1990 | Bishop et al. | |
| 5,027,315 A | * 6/1991 | Agrawal et al. | 326/38 |
| 5,028,818 A | 7/1991 | Go Ang et al. | |
| 5,337,273 A | * 8/1994 | McClure | 365/168 |
| 5,430,404 A | 7/1995 | Campbell et al. | |
| 5,572,145 A | * 11/1996 | Kinsella | 326/26 |
| 5,685,005 A | 11/1997 | Garde et al. | |
| 5,841,988 A | 11/1998 | Chennubhotla et al. | |
| 6,088,288 A | * 7/2000 | Spriggs et al. | 365/230.06 |
| 6,121,789 A | 9/2000 | Liu et al. | |
| 6,127,876 A | 10/2000 | Soltero | |
| 6,130,563 A | 10/2000 | Pilling et al. | |
| 6,154,083 A | * 11/2000 | Gaudet et al. | 327/312 |
| 6,166,582 A | * 12/2000 | Tseng et al. | 327/384 |
| 6,240,000 B1 | * 5/2001 | Sywyk et al. | 365/49 |

FOREIGN PATENT DOCUMENTS

JP          408228158 A  *  9/1996  ............ H03M/9/00

OTHER PUBLICATIONS

IBM TDB, Jul. 1997, US, vol. 40, issue 7, p. No. 65–68.*
IBM TDB, Aug. 1986, US, vol. 29, issue 3, p. No. 1144–1148.*
"Positive Ground Bounce Protection Circuit," IBM Technical Disclosre Bulletin, Sep. 1979, 2 pgs.
"Positive Ground Bounce Protection Circuit," IBM Technical Disclosre Bulletin, Oct. 1980, 1 pg.
"On–SIMM Resistance Terminators for Solving Ground Bounce Noise on Control Lines," IBM Technical Disclosre Bulletin, Jul. 1997, 2 pgs.

* cited by examiner

*Primary Examiner*—Thomas Lee
*Assistant Examiner*—Nitin C Patel
(74) *Attorney, Agent, or Firm*—Meyertons Hood Kivlin Kowert & Goetzel, P.C.; B. Noël Kivlin

(57) ABSTRACT

The present invention relates to a method and related structure for reducing ground bounce during write operations from a microprocessor. More specifically, the address and data signal lines of the microprocessor are divided into three transmission groups. The first transmission group transitions its data onto the bus lines with no delay. The second transmission group transitions its signal lines onto the bus with a half clock period delay of the core frequency clock. Finally, the third transmission group transitions its signal lines onto the bus with a full clock period delay of the core frequency clock. In this way, parallel writes by the microprocessor have their current sinking associated with that write distributed over an entire clock period of the core frequency clock such that ground bounce associated with that current sinking is reduced.

9 Claims, 4 Drawing Sheets

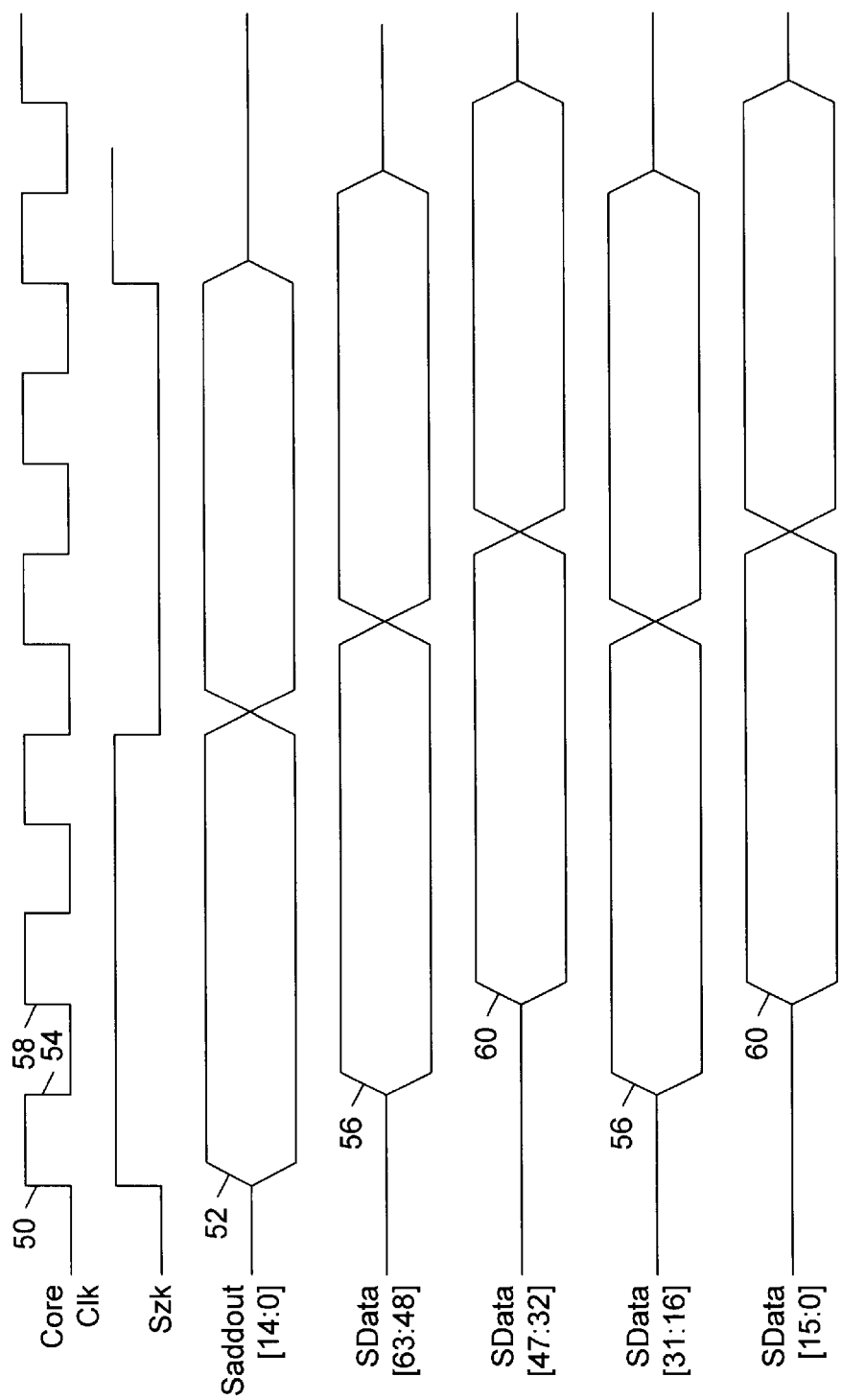

SYSTEM AND METHOD FOR REDUCING A GROUND BOUNCE DURING WRITE BY SELECTIVELY DELAYING ADDRESS AND DATA LINES WITH DIFFERENT MULTIPLE PREDETERMINED AMOUNT OF DELAY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to microprocessors for computer systems. More specifically, the present invention relates to writing information to address and data buses by a microprocessor in a computer system. More specifically still, the invention relates to reducing ground bounce during write operations by a microprocessor.

2. Background of the Invention

Computer systems generally comprise many components, but the heart of any computer system is the microprocessor or central processing unit. Early computer systems may have had a single microprocessor that was responsible for performing instructions and doing calculations as commanded by software operating in the system. As computer software technology advances, computer systems may comprise many microprocessors with varying degrees of computing capability. Some computer systems may have parallel processors to ease the processing load on any one microprocessor. Other computer systems may distribute microprocessors throughout the system with each dedicated to particular functions, for example, there may be a dedicated microprocessor to operate an array of storage devices for the computer system.

In having the ability to execute programs and perform calculations, vast amount of information must be transferred to and written from any particular microprocessor. Microprocessors typically write information from over a plurality of communication buses.

While microprocessors generally have some limited serial communication capabilities, the bulk of microprocessor data communication occurs over parallel communication buses. Using a parallel bus, significant amounts of information exchange between devices in each transfer clock period. For example, an address bus may have fifteen address signal lines coupling the microprocessor to a device with which the microprocessor wishes to communicate. By selectively driving this plurality of address data lines high or low, the microprocessor communicates an address relevant to a write operation. All these exemplary address lines in a parallel scheme transition simultaneously. That is, the microprocessor drives each of these plurality of address signal lines to a high or low state at the same time.

Likewise, data transfer in a parallel bus scheme involves driving a plurality of data signal lines to a high or low state to represent binary information. A data bus could be, for example, 64 data lines wide with the high or low state of each data line representing one bit of information. If a byte represents 8 bits of information, it is clearly seen that a 64 bit wide data bus has the capability of transferring 8 bytes of information in a parallel fashion. Just like the address lines described above, when a microprocessor transfers data across the data bus, the microprocessor places eight bytes of information, that is 64 bits, onto the data lines. The microprocessor accomplishes this task by driving the data lines high or low to represent bits of information. The microprocessor drives these lines simultaneously to facilitate the parallel transfer of information. Thus, for a single parallel exchange of information, a microprocessor may have to drive as many as 79 address and data lines simultaneously. Systems with large cache may require more address lines, e.g. 20. Moreover, server systems may have as many as 512 data lines. The number of data lines a microprocessor may have to drive increases with the addition of clock forwarding for groups of address and data lines as well as error correction lines used in error correction coding schemes.

While many types of bus architectures exist, a common bus architecture of the prior art is the open drain bus architecture. In a bus having an open drain architecture, each address and data signal line attaches to a high voltage through a pull up resister. When the address and/or data bus lines are not in use, the pull up resister pulls the voltage on each line to a high level. When a microprocessor writes information to the address and data lines, the microprocessor selectively leaves the bus in a high voltage condition, to indicate a first state, or pulls the bus down to a low voltage condition, to indicate a second state. In this way, devices writing to buses having an open drain architecture need not source current to charge the bus transmission lines associated with each address and data signal line; rather, the writing device need only sink or drain the current from the address and bus signal lines. While this technique may solve problems related to sourcing current for write operations, new problems arise with respect to sinking current by a writing device.

Resistance and inductance are generally parasite in the design of electric circuits. One of these circumstances is electrically coupling various electronic devices in a modular type computer system. Every location where a detachable electrical connection is made has some inherent resistance and inductance. The resistance element may be attributable to the physical coupling between two electrical conductors. The inductance element may be attributable to other conductive traces located in close physical proximity to the electrical connection at issue. Regardless of the source of the resistance and inductance, these electrical parameters cause undesirable voltages to develop across electrical connectors.

All the current drained to ground or common by the microprocessor must pass through the electrical connector that couples the microprocessor to the motherboard. As the microprocessor simultaneously drives address and data lines by sinking current, there is marked increase in current flow through the ground or common connector associated with this current sinking operation. The resistive element creates a voltage directly proportional to the current flow through the connector. However, the inductive element of the electrical connector creates a voltage that increases with the rate of change current through the electrical connector. Thus, in the instant in time when the microprocessor simultaneously drives all of its address and data signal lines, significant parasitic voltages are created across the electrical connector. Because of these parasitic voltages across the ground or common connector, the operating voltage of the microprocessor drops. This phenomenon is known as ground bounce. If the parasitic voltage across the electrical connector becomes sufficiently high, and therefore the operating voltage seen by the microprocessor becomes sufficiently low, operation of the microprocessor may be impaired.

Prior art devices address this phenomena of ground bounce by having multiple ground or common connectors through which to sink current during write operations by the microprocessor. While this technique may have helped the ground bounce phenomenon by reducing resistance and inductance, those effects are still felt in current microprocessor design technology.

Despite the desirability of reducing ground bounce during write operations of a microprocessor, no suitable system has been developed.

BRIEF SUMMARY OF THE INVENTION

The problems noted above are solved in large part by a technique and related circuit which delays driving of selected address and data signal lines within a clock period of the core frequency clock. Delaying the sinking of currents across the ground connector reduces the voltage created associated with the parasitic inductance of a physical connector. More specifically, the plurality of address and data signal lines associated with a write by a microprocessor are grouped into three transmission groups. A first transmission group preferably comprises only the address signal lines. The microprocessor preferably asserts the address signal lines without delay inasmuch as the receiving device, most likely a bridge circuit, needs the address lines as an indication of what to do with the associated data. The data signal lines are preferably grouped into two further transmission groups. The microprocessor delays assertion of a first of these two transmission groups by half a clock period of the core frequency clock. That is, the microprocessor delays the sinking of current of any of the data signal lines in the second transmission group by half a clock period of the core frequency clock. Further, the microprocessor preferably delays by an entire period of the core frequency clock assertion of the data signal lines associated with the third transmission group.

In this way, the change in current flow through any particular ground connector is distributed over a period of time being the period of one complete clock signal of the core frequency clock. Thus, voltage build up across the connector associated with the parasitic inductive element is reduced because the change in current flow associated with a particular write operation is spread over an entire clock period of the core frequency clock rather than having the microprocessor sink all the current associated with all the address and data signal lines at one time. This reduces the voltage build up across the ground or common connectors which therefore reduces ground bounce.

BRIEF DESCRIPTION OF THE DRAWINGS

For a detailed description of the preferred embodiments of the invention, reference will now be made to the accompanying drawings in which:

FIG. 4 shows a timing diagram showing assertion of various signals associated with the preferred embodiment of the this invention.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" in the context of physically connecting two devices is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

The preferred embodiment of the present invention concerns writing of data from a microprocessor. More specifically, the preferred embodiment of the present invention relates to a method and related structure of writing data from a microprocessor that reduces ground bounce associated with that write.

The bulk of information transferred or written from a microprocessor is done across a parallel transfer bus. By parallel it is meant that a significant number of bits of information transfer in one clock period of a transfer clock. More specifically, and in the preferred embodiment, there are 64 bits of information that may be transferred during each half period of a transfer clock during a write operation. If it is desired to transfer a 128 bit wide piece of information, this transfer requires one complete clock period of the transfer clock, 64 bits of information transferred during each half period. Thus, the microprocessor of the preferred embodiment has 64 digital signal lines that it drives with data. For purposes of this specification, these 64 data lines are referred to as SDATA[63:0].

However, the microprocessor preferably does more than just drive data to its data signal lines SDATA[63:0]. The microprocessor also preferably identifies the data by means of a plurality of address signal lines. In addition to transitioning, writing valid data, to the data signal lines, in each transfer of information during a transfer clock period the microprocessor preferably asserts or drives 15 address signal lines. The value of these address signal lines may represent, for example, a destination for the data which the CPU drives onto the data signal lines. For purposes of this specification, the address signal lines are referred to SADDOUT[14:0].

Figure 1:
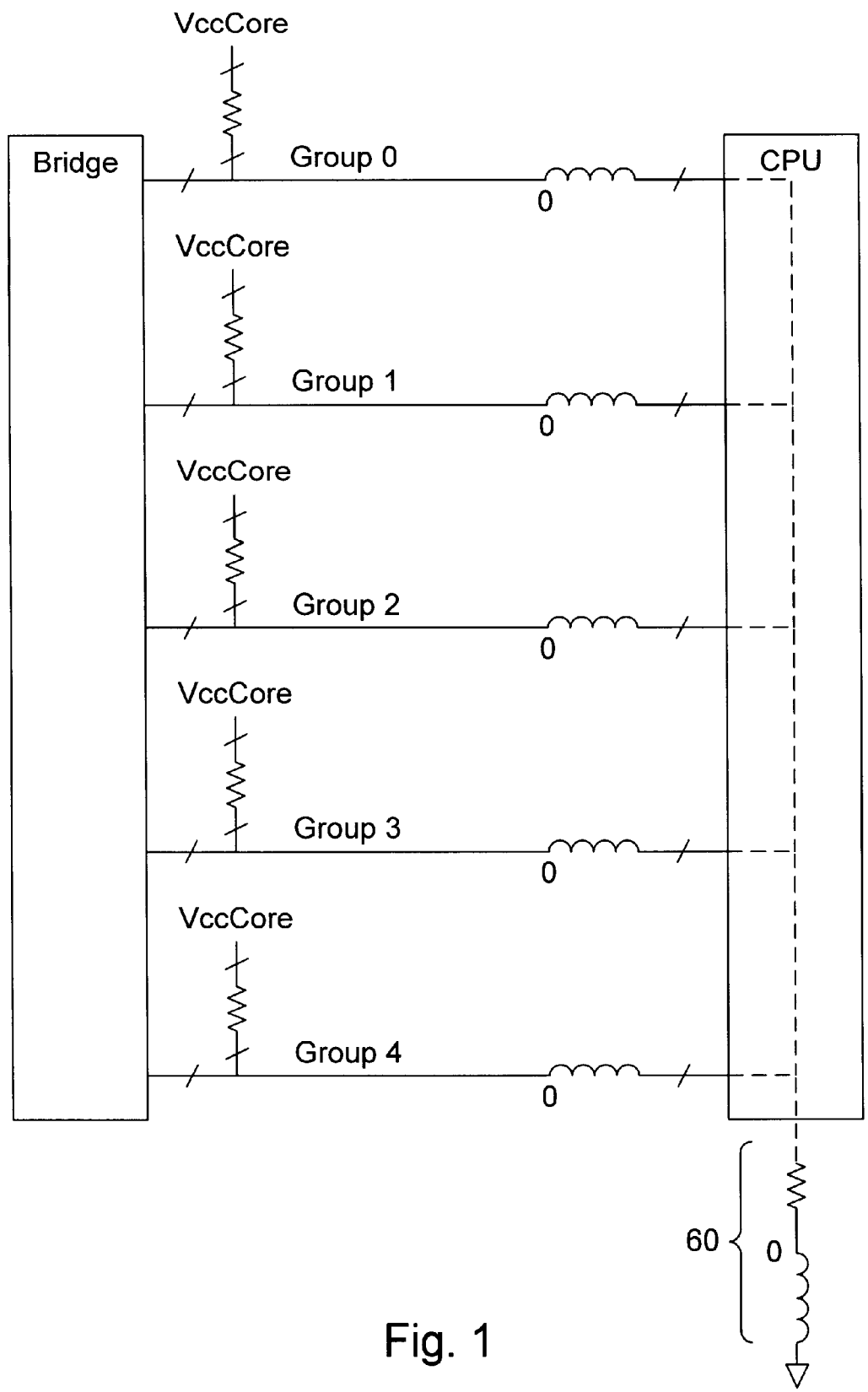
FIG. 1 shows an exemplary partial schematic showing electrical connections between a bridge device and a CPU including parasitic resistance and inductance on one of the exemplified groups.

During each write operation by the microprocessor, the microprocessor preferably transitions at least 64 SDATA lines to represent valid information and further transitions 15 SADDOUT lines to represent an address of the desired destination of the data written. Preferably each address and data bus line, to which the address and data signal lines couple, has a pull up resister circuit on each end. That is, if a bus runs between a microprocessor and a bridge device, for example, each address and data signal line has a pull up resister circuit proximate to each of the CPU and bridge logic circuit (FIG. 1). Thus, in an idle condition, each address and data signal line of the bus network has a high voltage.

Information in a binary system is represented by either a logic "0" or a logic "1." As applied to address and data signal lines, these logic "0" and logic "1" are assigned high and/or low voltages. For example, a high voltage on a single data signal line may represent a logic "1." Likewise, a low voltage on a single data signal line may represent a logic "0." It may be possible to reverse these assigned logic states. For a CPU to write a bit of information onto a data signal line requires that the CPU place a high or low voltage on the data signal line. In the open drain bus architecture of the preferred embodiment, a CPU need not take action to place a high voltage on any particular address or data bus line inasmuch as the bus line defaults to a high voltage condition. However, if the CPU needs to place a low voltage on a particular address or data signal line, the CPU must ground or sink the current on that signal line. While a microprocessor in an open drain bus computer system need not be capable of sourcing current to drive address and data values onto a bus, the microprocessor must have the capability of sinking current off the bus to assert or transition the various address and data signal lines. In non-open drain bus architectures, for example bus architectures requiring a push-pull interface, a microprocessor must source current onto the bus signal line to represent a high voltage and likewise ground the bus signal line to represent a low voltage. In this instance it is possible that the capacitive effect of each bus signal line may source non-negligible current during the sinking operation. Therefore, ground bounce is also a problem in bus interfaces requiring a push-pull interface, although the ground bounce is not likely to be as pronounced.

In the preferred embodiment of this invention the microprocessor itself attaches to a motherboard of a computer system by way of a slot connector. That is, the microprocessor is preferably connected to an electrical circuit card, although socket mount microprocessors may benefit as well. The plurality of address and data signal lines of the microprocessor couple to traces on the electrical circuit card that run to a card connector. The card connector has an equal plurality of electrical pads, preferably coupled one each to each of the electrical traces coupled to the microprocessor. By mounting a microprocessor to an electrical card in this manner, the motherboard requires less surface area for mounting the CPU. Further, and it is preferably the case, onboard cache may also be placed on the circuit card. The motherboard has a complimentary mating connection whereby the electrical card on which the microprocessor is mounted couples physically and electrically to the motherboard. Thus, each address and data signal line of the microprocessor couples to the rest of the computer system through this card connector. Likewise, any current which the microprocessor sinks in transitioning address and data signal lines flows through the connector to the microprocessor, then back through the connector across ground or common electrical connections. Given that the electrical coupling across this card connector is the physical touching of two conductors, some parasitic resistance, inductance and capacitance exists. In particular it is the parasitic resistance and inductance, exemplified schematically in FIG. 1, which causes problems that the preferred embodiment of this invention addresses.

For purposes of explanation, a single exemplary write of information by the microprocessor is considered. In this exemplary write of information it is assumed the logic state of each data signal line and each address signal line must be transitioned to a low voltage. That is, the microprocessor in this exemplary write sinks current from all 64 data signal lines and all 15 address lines. In such a situation, current flows from the computer system motherboard through the electrical connector to the microprocessor itself, and then back out one or more ground or common connectors back to the motherboard. While there may be multiple ground or common connectors, preferably there are significantly fewer ground or common connectors than address or data signal lines. Thus, each ground or common connector must support sinking current from multiple signal lines as shown in FIG. 1. It is at these ground or common connections between the motherboard and the electrical card of the microprocessor that the parasitic resistance and inductance have a significant effect. Of particular concern in the parasitic inductance of the connector. As one of ordinary skill in the art is aware, the voltage generated across an inductance is proportional to the rate of change of current through that inductance. In the exemplary situation where all 64 data lines and all 15 address lines are transitioned, a significant change in current flow through the ground connector 60 occurs at the point in time when the CPU transitions the respective signals. Thus, a large voltage may be created by the parasitic inductance associated with the connector for the ground or common. This increase in voltage associated with the transitioning of current is known as ground bounce. The preferred embodiment addresses ground bounce by staggering assertion or transitioning of various address and data signal lines such that the rate of change of current through any particular ground or common connection is distributed over an amount of time such that the ground bounce is reduced.

Figure 2:
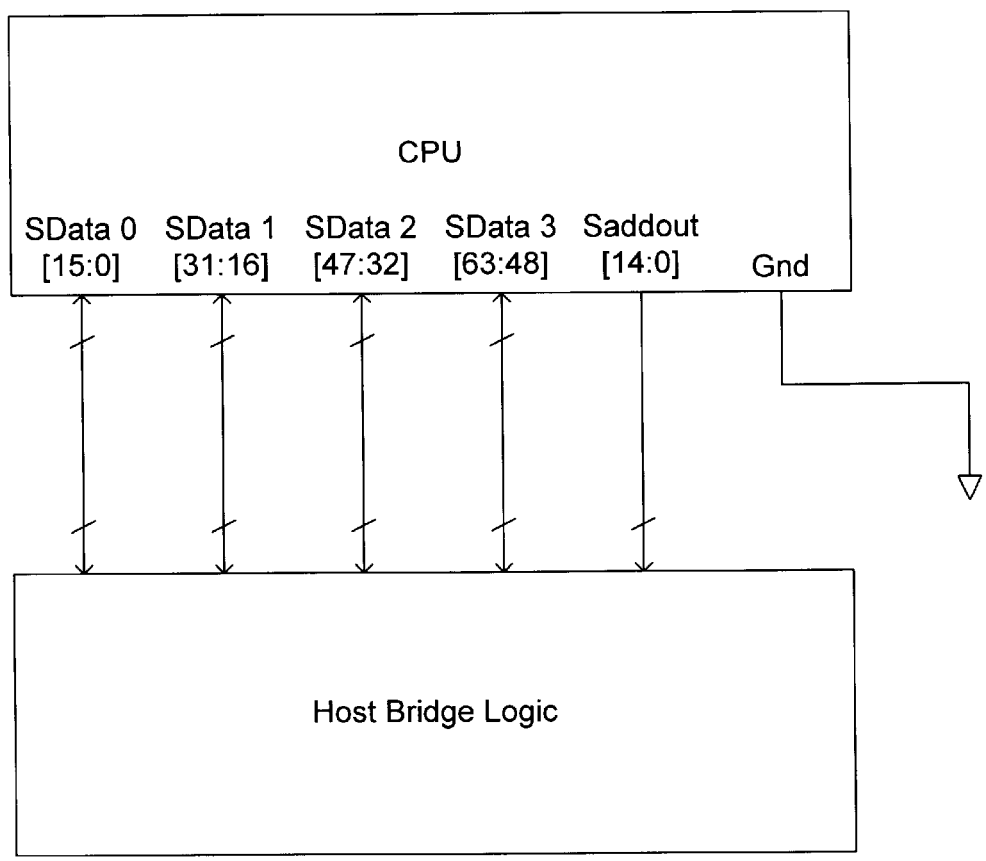
FIG. 2 shows an exemplary partial schematic of the electrical connections between a CPU and a host bridge logic including groupings of address and data lines.

There are 64 data signal lines and 15 address lines of the microprocessor of the preferred embodiment. For reasons not associated with the present invention, the 64 data signal lines are preferably divided into four groups. These four groups, shown in FIG. 2, are SDATA0 which comprises the data signal lines SDATA[15:0], SDATA1 which comprises data signal lines SDATA[31:16], SDATA2 which comprises data signal lines SDATA[47:32], and SDATA3 which comprises data signal lines SDATA[63:48]. The SDATA signal lines are sub-grouped in this manner because each of these groups represents a clock forwarded grouping. One of ordinary skill in the art is well aware of clock forwarding techniques and the advantages obtained thereby. The preferred embodiment of this invention also transmits error check codes ("ECC"), with each ECC bit requiring a signal line similar to the address and data signal lines. Preferably, two bits of ECC information transfer along with each of the four data signal groups. Therefore, the microprocessor of the preferred embodiment may have as many as 85–87 address and data signal lines to transition with each write operation depending on the number of address lines. If each of the 85–87 address, data and ECC signal lines requires a low voltage state, the microprocessor sinks significant current through its ground or common connectors. If the microprocessor sinks this current all at once, which was the state of the art before this invention, significant ground bounce occurs.

In the preferred embodiment of this invention, the four data signal sub-groups are divided into two transmission groups. That is, primary group two, SDATA2[47:32] and primary group zero, SDATA[15:0], are grouped into a transmission group. Likewise, primary group one, SDATA1 [31:16], and primary group three, SDATA3[63:48] are grouped into a transmission group two. Finally, the address lines SADDOUT[14:0] are assigned to be transmission group zero.

FIG. 4 shows an exemplary timing diagram of a data transfer of the preferred embodiment in relation to the core frequency clock and the transfer or socket to microprocessor ("S2K") clock. The S2K clock represents the clock by which information transfers from the microprocessor of the preferred embodiment to a receiving device. The receiving device may be, and as is shown in FIG. 2, a bridge logic device. However, the preferred embodiment of this invention is not limited to a write operation from a microprocessor to a bridge device only. The bus on which the microprocessor writes data may be used to communicate to other computer system components, including other microprocessors. The transitioning or assertion of address and data signal lines preferably is accomplished in three steps. On the first rising edge 50 of the core frequency clock of a write operation, transmission group zero 52 has its logic states transitioned onto the bus. Thus, the current sinking requirement associated with transitioning the address lines of transmission group zero occurs during the first half clock period of the core frequency clock. On the subsequent falling edge 54 of the core frequency clock transmission group one 56 has its logic states transitioned onto the data bus. On the subsequent rising of the core frequency clock 58 transmission group two 60 has its logic states transitioned onto the data bus. Therefore, the current sinking of the various address and signal data lines distributes over one complete period of the core frequency clock.

Figure 3:
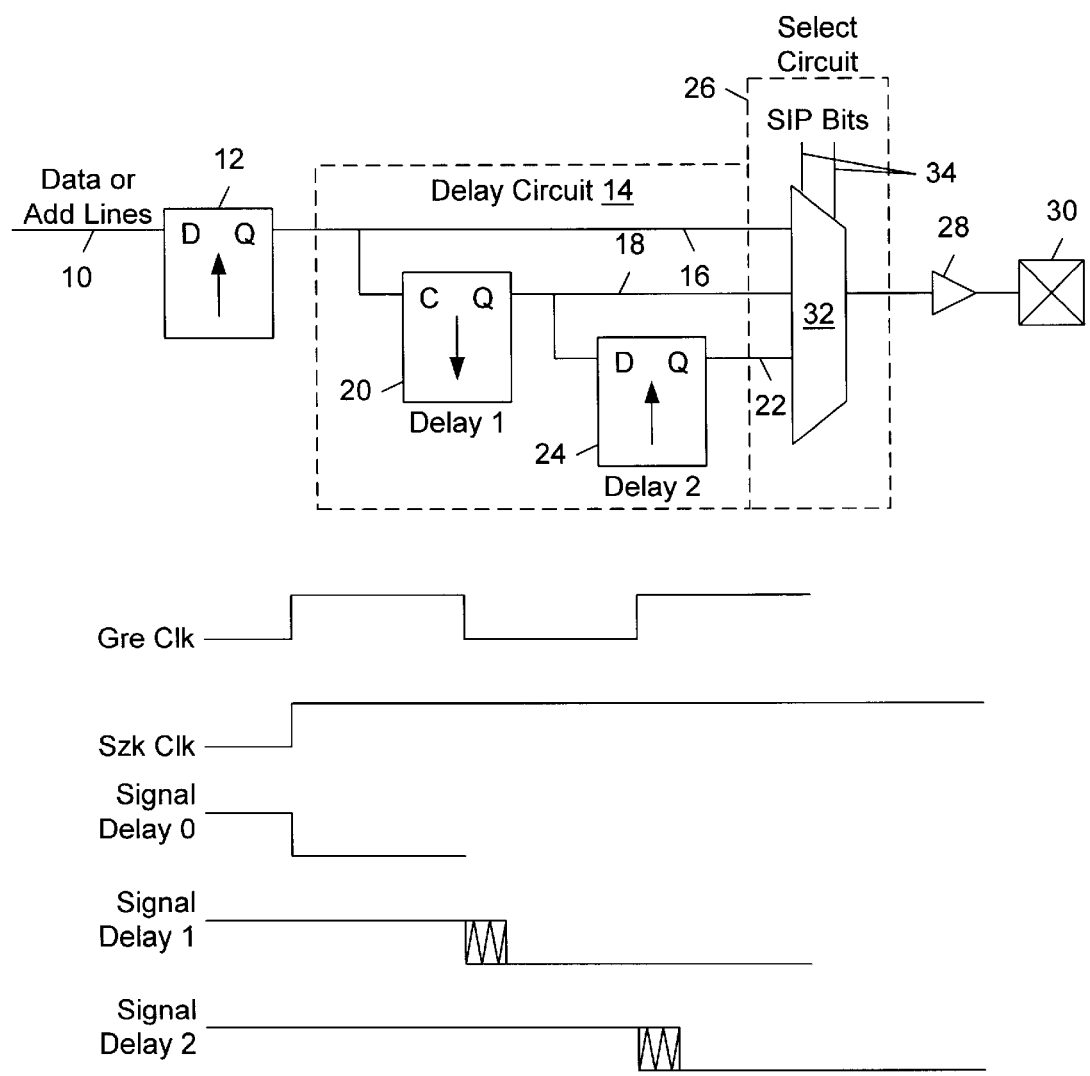
FIG. 3 shows an electrical schematic of a delay circuit.

FIG. 3 shows a timing diagram of assertion of various signals of one exemplary data and/or address line and also shows an electrical circuit drawn in such a manner that the various signals are easily associated with their respective hardware. More specifically, FIG. 3 shows data or address lines 10 coupled to a latching flipflop 12. The data or address signals lines preferably come from the core of the microprocessor and therefore are only asserted for a short amount of time. Thus, latching flipflop 12 holds information as written from the core of the microprocessor. The output of the latching flipflop 12 couples to the delay circuit 14. As the name implies, the delay circuit 14 creates time delayed representations of the information held by the latching flipflop 12.

In the preferred embodiment, the delay circuit 14 produces three output signals. The first is a no delay representation 16 which is effectively just a pass through of the information held by the latching flipflop 12. The first delay output 18 of the delay circuit 14 is a time delayed representation of the information held in the latching flipflop 12. The delay associated with this output is preferably half the period of the core frequency clock as shown in FIG. 3. This first delay output 18 is preferably created by delay flipflop 20. Delay flipflop 20 latches on the falling edge of the core frequency clock. Thus, valid data available at the output of the latching flipflop 12 does not become valid data at the output of the delay flipflop 20 until a subsequent falling edge of the core frequency clock. Thus, the delay flipflop 20 produces a time delay representation where that delay is half the clock period of the core frequency clock. The second delay output signal 22 of the delay circuit 14 is a time delayed representation of the data held by the latch flipflop 12. Preferably, valid data is not available on the output of the second delay flipflop 24 until a full clock period has passed of the core frequency clock. As indicated in FIG. 3, the delay flipflop 24 creates this time delayed representation by coupling to the output of the delay flipflop 20 and clocking on a rising edge of the core frequency clock. Thus, the delay circuit 14 passes through a no delay output signal 16, generates a first delay output signal 18, delayed by half a clock period of the core frequency clock, and a second delay output signal 22, delayed by a full period of the core frequency clock.

The delay circuit 14 couples to select circuit 26. In broad terms, select circuit 26 selects one of the outputs of the delay circuit 14 and passes that selected representation to a driver circuit 28 and onto pad 30 of the card connector on which the microprocessor is mounted. The preferred embodiment of the select circuit 26 comprises a multiplexer 32 having its inputs coupled to the outputs of the delay circuit 14. The multiplexer 32 selects one of its inputs to couple to its output based on the asserted or non-asserted state of its select inputs 34. The select inputs 34 coupled to bits of information held in registers in the microprocessor itself. These registers gather their information during initialization of the microprocessor. More specifically, during microprocessor initialization, a series of bits are transferred serially into the microprocessor. Preferably the bit stream loaded during an initialization is 32 bits long. The preferred embodiment of this invention allocates six of those 32 bits to identify respective transmission phase delay of each of the three transmission groups. The transfer of these 32 bits of information is done based on a protocol know as the Serial Initialization Protocol ("SIP"). Thus, these bits are known as SIP bits.

Returning again to FIG. 3, the select inputs 34 of the multiplexer 32 couple to the SIP bits. More specifically, the select inputs 34 are coupled to SIP bits associated with a particular transmission group. For example, let the data and/or address line 10 be one of the SADDOUT signals, which is assigned to transmission group zero. The particular circuit for one of these address lines would include a latch circuit 12, a delay circuit 14, and select circuit 26. Because the particular address signal line is in transmission group zero, the select inputs 34 would couple, in this example, to the two registers within the microprocessor that hold SIP bits associated with transmission group zero. It is noted that preferably transmission group zero transitions onto the address bus without delay, and therefore, preferably the select circuit 26 for each of the address lines preferably selects the no-delay output signal 16 from its respective delay circuit 14.

As described above, the microprocessor of the preferred embodiment has 13 address signal lines and 64 data signal lines. Each of these address and data signal lines couples one each to a latch flipflop 12, a delay circuit 14, a select circuit 26, a driver circuit 28 and a pad 30. The select inputs 34 from each select circuit 26 of transmission group zero couple to registers that hold values representing the delay for the transmission group zero. Likewise, select inputs on 34 for each data line of the first transmission group (preferably SDATA[63:48] and SDATA[31:16]) coupled to registers containing values representing the transmission delay with respect to transmission group one.

The above discussion is meant to be illustrative of the principles and various embodiments of the present invention. Numerous variations and modifications will become apparent to those skilled in the art once the above disclosure is fully appreciated. For example, the select circuit 26 is described to be comprised of a multiplexer 32, however, if only two delay states are needed a series of AND gates could perform the function. Likewise, the grouping of the address and data lines need not be as described herein. Any combination of address and data lines into transmission groupings where at least one of those transmission groupings has its transitioning delayed would be within the contemplation of this invention. It is intended that the following claims be interpreted to embrace all such variations and modifications.

What is claimed is:

1. A method of reducing ground bounce during write operations onto a bus having an open drain architecture, comprising:

arranging a plurality of data signal lines into four clock forwarded groups;

arranging said four clock forwarded groups into a first and second transmission group, each transmission group containing two of the four clock forwarded groups;

arranging a plurality of address signal lines into a third transmission group;

using selection information to select a desired transmission delay for each of at least the first and second transmission groups;

driving said third transmission group onto an address bus;

delaying driving onto a data bus said first transmission group by a first predetermined amount of delay dependent on said selection information;

delaying driving onto said data bus said second transmission group by a second predetermined amount of delay which is different from the first predetermined amount of delay dependent on said selection information.

2. The method of claim 1 wherein said delays in driving are based on a clock period of a core frequency clock.

3. The method of claim 1 wherein said selection information is transferred from a register in a microprocessor.

4. The method of claim 1 wherein the first predetermined amount of delay is half a clock period.

5. The method of claim 1 wherein the second predetermined amount of delay is a full clock period.

6. A system reducing ground bounce during write operations onto a bus having an open drain architecture, comprising:

a plurality of data signal lines grouped into four clock forwarded groups, wherein
said four clock forwarded groups are arranged into a first and second transmission group, each transmission group containing two of the four clock forwarded groups;

a plurality of address signal lines grouped into a third transmission group;

a first plurality of delay circuits, each of said data signal lines coupled one each to a delay circuit of the first plurality of delay circuits, wherein the delay circuits are adapted to create at least two time delayed representations of the data signal line to which it is coupled;

a second plurality of delay circuits, each of said address signal lines coupled one each to a delay circuit of the second plurality of delay circuits, wherein the delay circuits are adapted to create at least two time delayed representations of the address signal line to which it is coupled;

a select circuit associated with each delay circuit, said select circuit adapted to select between a no-delay representation and the time delayed representation of a data or address signal line, wherein said selection is controlled by selection information.

7. The system of 6 wherein said select circuit further comprises a multiplexer having one input coupled to said data or address signal line, and a second input coupled to the output of the delay circuit, wherein said multiplexer is controlled by said selection information to couple to its output either said data or address signal line, or said output of the delay circuit.

8. The system of claim 6 wherein said time delayed representations are based on a clock period of a core frequency clock.

9. The system of claim 6 wherein said selection information is transferred from a register in a microprocessor.

* * * * *